United States Patent [19]

Ikeda et al.

[11] Patent Number: 5,471,067
[45] Date of Patent: Nov. 28, 1995

[54] SEMICONDUCTOR METAL CONTACTING STRUCTURE AND A LIGHT EMITTING DEVICE

[75] Inventors: Masao Ikeda; Satoshi Ito; Yoshino Iochi; Takao Miyajima; Masafumi Ozawa; Katsuhiro Akimoto; Akira Ishibash; Futoshi Hiei, all of Kanagawa, Japan

[73] Assignee: Sony Corporation, Tokyo, Japan

[21] Appl. No.: 78,037

[22] Filed: Jun. 18, 1993

[30] Foreign Application Priority Data

Jun. 19, 1992 [JP] Japan .................................. 4-185821
Apr. 21, 1993 [JP] Japan .................................. 5-117678
Apr. 28, 1993 [JP] Japan .................................. 5-125521

[51] Int. Cl.$^6$ .......................... H01L 27/14; H01L 31/00
[52] U.S. Cl. ......................... 257/14; 257/15; 257/94
[58] Field of Search .......................... 257/13, 14, 15, 257/22, 94, 101, 103

[56] References Cited

U.S. PATENT DOCUMENTS

| | | | |
|---|---|---|---|
| 4,616,241 | 10/1986 | Biefeld | 257/13 |
| 4,905,060 | 2/1990 | Chinone et al. | 257/13 |
| 5,103,269 | 4/1992 | Tomomura et al. | 257/94 |
| 5,260,958 | 11/1993 | Fitzpatrick | 257/13 |
| 5,268,918 | 12/1993 | Akimoto et al. | 257/13 |
| 5,274,248 | 12/1993 | Yokogawa et al. | 60/92 |

FOREIGN PATENT DOCUMENTS

| | | |
|---|---|---|
| 0282407 | 9/1988 | European Pat. Off. . |
| 0359329 | 3/1990 | European Pat. Off. . |
| 0334637 | 9/1991 | European Pat. Off. . |
| 0433542 | 12/1991 | European Pat. Off. . |
| 61-26271 | 2/1986 | Japan .......................... 257/22 |
| 2-40957 | 2/1990 | Japan .......................... 257/14 |

OTHER PUBLICATIONS

Esake et al, "Ion Beam Epi Growth Method", *IBM Tech Discl*, vol. 12 No. 12, May 1970, p. 2134.

Wang et al, "Theory and Applications of Band–Aligned Superlattices", *IEEE Journal of Quantum Electronics*, vol. 25, No. 1, Jan. 1989, pp. 12–19.

Kishino et al, "Enhanced carrier confinement effect by the multiquantum barrier in 660 nm GaInP/AlInP visible lasers", *Appl. Phys. Lett.*, vol. 58, No. 17, 29 Apr. 1991, pp. 1822–1824.

Jeon et al, "Blue and green diode lasers in ZnSe–based quantum wells", *Appl. Phys. Lett.*, vol. 60, No. 17, 27 Apr. 1992, pp. 2045–2047.

*Primary Examiner*—Sara W. Crane
*Assistant Examiner*—Stephen D. Meier
*Attorney, Agent, or Firm*—Hill, Steadman & Simpson

[57] ABSTRACT

A semiconductor laser capable of emitting blue or green light is disclosed. The semiconductor laser comprises an n-type ZnMgSSe cladding layer, an active layer, a p-type ZnMgSSe cladding layer, a p-type ZnSe contact layer and a p-type ZnTe contact layer which are stacked in this sequence on an n-type GaAs substrate. A p-side electrode is provided on the p-type ZnTe contact layer. An n-side electrode is provided on the back surface of the n-type GaAs substrate. A multiquantum well layer comprising quantum wells made of p-type ZnTe and barriers made of p-type ZnSe is provided in the depletion layer produced in the p-type ZnSe contact layer along the junction interface between the p-type ZnSe contact layer and the p-type ZnTe contact layer. Holes injected from the p-side electrode pass through the junction by the resonant tunneling effect through quantum levels formed in the quantum wells of the multiquantum well layer.

12 Claims, 7 Drawing Sheets

5,471,067

SEMICONDUCTOR METAL CONTACTING STRUCTURE AND A LIGHT EMITTING DEVICE

BACKGROUND OF THE INVENTION

Field of the Invention

This invention relates to a semiconductor device and, in particular, to a semiconductor device such as a light emitting device or the like using II-VI compound semiconductors.

Description of the Prior Art

Recently, in order to improve the recording density of optical discs and the resolution of laser printers, semiconductor lasers capable of emitting light having short wavelength are increasingly desired, and there are active researches to realize them.

The present Applicant made vigorous researches to meet the demand and proposed a semiconductor laser capable of emitting blue or green light which uses a sort of II-VI compound semiconductors, namely, ZnMgSSe compound semiconductor, as the material for its cladding layers. In this semiconductor laser, a laser structure including an n-type ZnMgSSe cladding layer, an active layer and a p-type ZnMgSSe cladding layer (not shown) is provided on an n-type GaAs substrate, and a p-type ZnSe contact layer is provided on the p-type ZnMgSSe cladding layer. On the p-type ZnSe contact layer is provided a p-side electrode, and on the back surface of the n-type GaAs substrate is provided an n-side electrode.

With this structure, the p-side electrode has a high contact resistance with respect to the p-type ZnSe contact layer, and it is difficult to obtain a good ohmic contact. Major reasons thereof are that the carrier concentration obtained by doping p-type impurities into ZnSe is as low as the order of $\sim 10^{17} cm^{-3}$ at maximum and that it is difficult to obtain a good ohmic contact with p-type ZnSe.

In addition, there is a band discontinuity in the valence band as large as 0.5 eV at the junction interface between p-type ZnSe (energy gap: 2.8 eV) and p-type ZnTe (energy gap: 2.3 eV). The valence band of p-type ZnSe is curved downward toward p-type ZnTe (see FIG. 4), and the changes in the valence band bulging downward behave as a potential barrier against holes injected from the p-side electrode to the p-type ZnSe/p-type ZnTe junction.

OBJECTS AND SUMMARY OF THE INVENTION

It is therefore an object of the invention to provide a semiconductor device that can effectively remove a potential barrier caused by a large band discontinuity of the valence bands or conduction bands at a semiconductor junction interface in and therefore has a good voltage-current characteristic.

A further object of the invention is to provide a semiconductor device in which a multiquantum well layer is provided in a depletion layer produced along a semiconductor junction interface and a potential barrier caused by a band discontinuity at the interface can be effectively removed by a resonant tunneling effect.

A still further object of the invention is to provide a semiconductor device in which, in the presence of a large band discontinuity in the valence bands or conduction bands at a semiconductor junction interface, the transmission probability of carriers through the junction when the bias voltage applied to the junction is near zero can be increased, to thereby make it easy for a current to flow through the junction.

According to an aspect of the invention, there is provided a semiconductor device, comprising:

a first p-type II-VI compound semiconductor;

a second p-type II-VI compound semiconductor; and a multiquantum well layer in a depletion layer produced in the first p-type II-VI compound semiconductor along the interface between the first p-type II-VI compound semiconductor and the second II-VI compound semiconductor, the top energy of the valence band of the first II-VI compound semiconductor being lower than the top energy of the valence band of the second p-type II-VI compound semiconductor, the multiquantum well layer comprising barriers made of the first p-type II-VI compound semiconductor and quantum wells made of the second p-type II-VI compound semiconductor.

According to another aspect of the invention, there is provided a semiconductor device, comprising:

a first n-type II-VI compound semiconductor;

a second n-type II-VI compound semiconductor; and a multiquantum well layer in a depletion layer produced in the first n-type II-VI compound semiconductor along the interface between the first n-type II-VI compound semiconductor and the second n-type II-VI compound semiconductor, the bottom energy of a conduction band of the first n-type II-VI compound semiconductor being higher than the bottom energy of a conduction band of the second n-type II-VI compound semiconductor, the multiquantum well layer comprising made of the first n-type II-VI compound semiconductor and quantum wells made of the second n-type II-VI compound semiconductor.

According to still another aspect of the invention, there is provided a semiconductor device, comprising:

a first electrode;

a semiconductor substrate on the first electrode;

a first cladding layer on the semiconductor substrate;

an active layer on the first cladding layer;

a second cladding layer on the active layer;

a multiquantum well layer made of a II-VI compound semiconductor on the second cladding layer; and a second electrode on the multiquantum well layer, the first cladding layer and the second cladding layer being made of II-VI compound semiconductors.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention are explained below with reference to the drawings.

Figure 1:
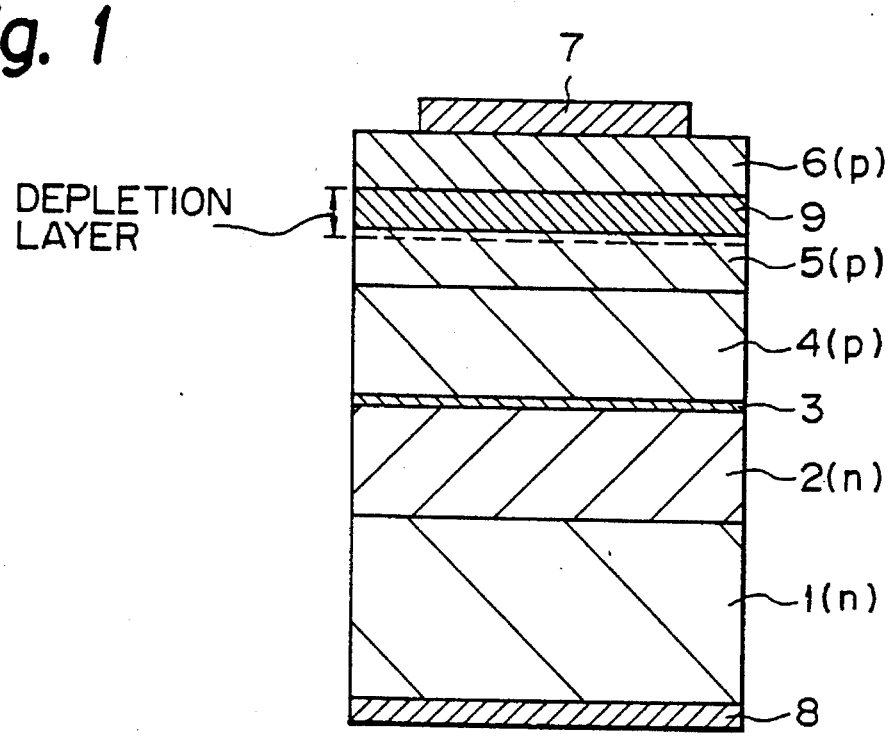
FIG. 1 is a cross sectional view of a semiconductor laser taken as a first embodiment of the invention.
Figure 2:
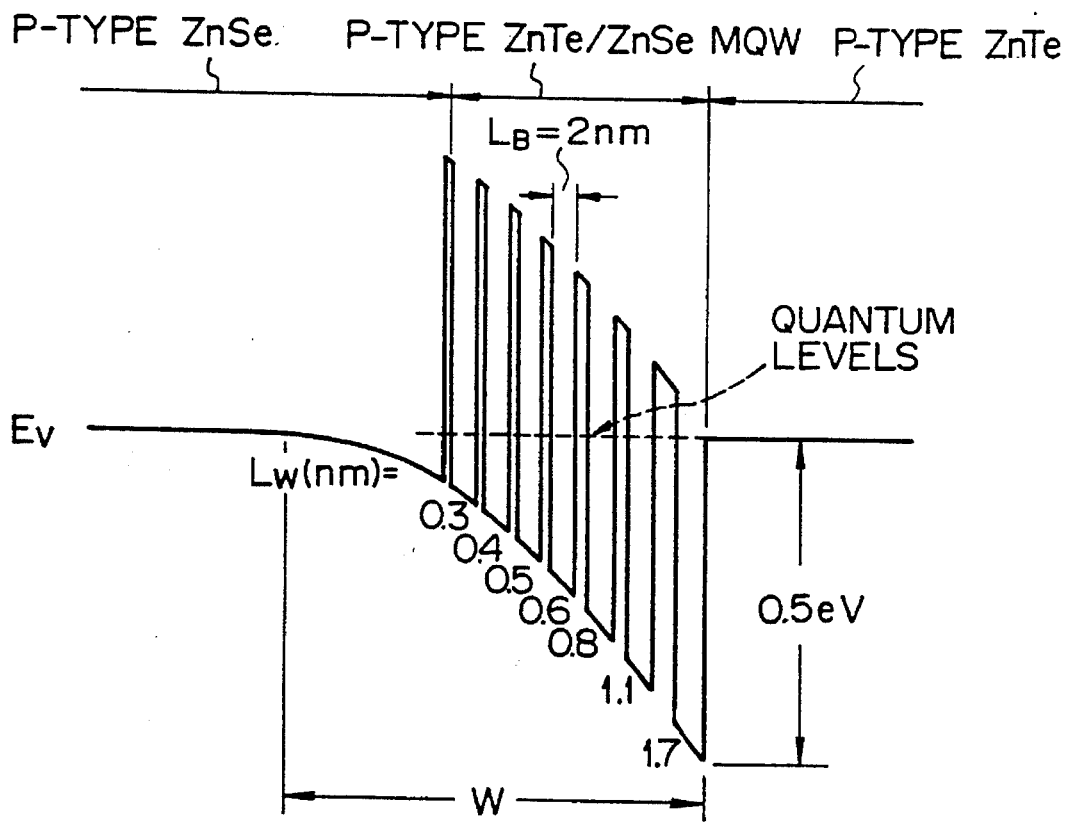
FIG. 2 is an energy band diagram of a portion extending from a p-type ZnSe contact layer to a p-type ZnTe contact layer in the semiconductor laser taken as the first embodiment.

FIG. 1 illustrates a semiconductor laser taken as a first embodiment of the invention. An n-type GaAs substrate 1 has a {100}-oriented surface and is doped with Si which is an n-type impurity. On the n-type GaAs substrate 1 are stacked, in sequence, an n-type ZnMgSSe cladding layer 2 doped with Cl as an n-type impurity, an active layer 3 made of, for example, ZnCdSe or ZnSe, a p-type ZnMgSSe cladding layer 4 doped with N as a p-type impurity, a p-type ZnSe contact layer 5 doped with N as a p-type impurity, and a p-type ZnTe contact layer 6 doped with N as a p-type impurity. On the p-type ZnTe contact layer 6 is provided an n-side electrode 7 made of Au or Au/Pd. On the back surface of the n-type GaAs substrate 1 is provided an n-side electrode 8. Reference numeral 9 refers to a p-type ZnSe/ZnTe multiquantum well (MQW) layer provided in a depletion layer produced in the p-type ZnSe contact layer 5 along the junction between the p-type ZnSe contact layer 5 and the p-type ZnTe contact layer 6. In other words, the p-type ZnSe/ZnTe multiquantum well (MQW) layer 9 is made by interposing quantum wells of p-type ZnTe in the depletion layer produced in the p-type ZnSe contact layer 5 along the junction between the p-type ZnSe contact layer 5 and the p-type ZnTe contact layer 6. As shown in FIG. 2, although barriers made of p-type ZnSe have the same thickness $L_B$, quantum wells made of p-type ZnTe have different thicknesses $L_W$ which increase in steps toward the p-type ZnTe contact layer 6. Specifically, the thickness $L_W$ of each quantum well made of p-type ZnTe is determined as explained below.

Figure 3:
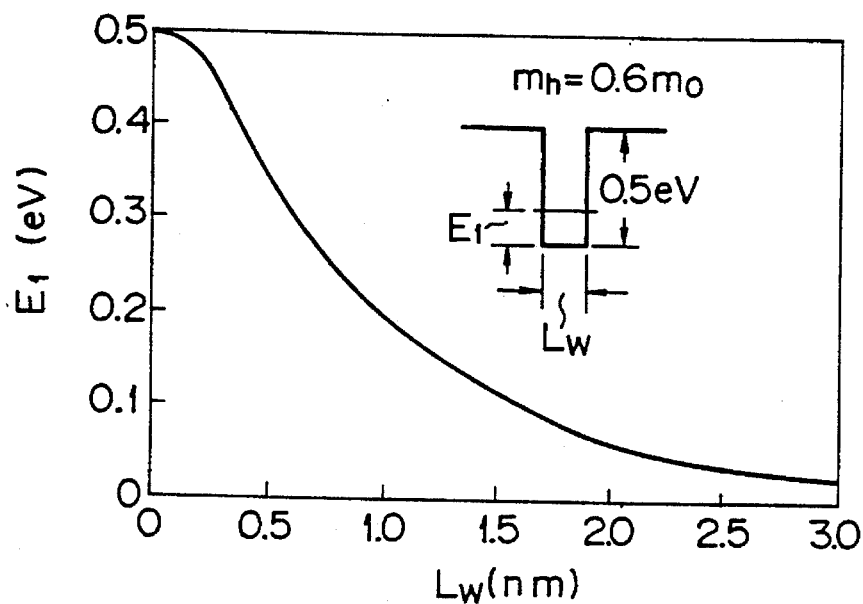
FIG. 3 is a graph illustrating changes in first quantum level $E_1$ of quantum wells made of p-type ZnTe with width $L_w$ thereof.

First, FIG. 3 is a diagram showing a result of quantum mechanical calculation of a finite barrier well-type potential to know how a first quantum level $E_1$ of a quantum well made of p-type ZnTe changes with the thickness $L_W$ of the quantum well in a single quantum well structure arranged by sandwiching the quantum well layer of p-type ZnTe by barriers made of p-type ZnSe from opposite sides thereof. In the calculation, by taking the effective mass $m_h$ of a hole in p-type ZnSe and p-type ZnTe as the mass of an electron in the quantum well and the barriers, 0.6 $m_0$ ($m_0$ is the rest mass of the electron) is used, and the depth of the well is 0.5 eV. It is known from FIG. 3 that the first quantum level $E_1$ formed in the quantum well made of p-type ZnTe can be lowered by decreasing the thickness $L_W$ of the quantum well. This is used in the first embodiment to vary the thickness $L_W$ of the quantum well layer made of p-type ZnTe.

Figure 4:
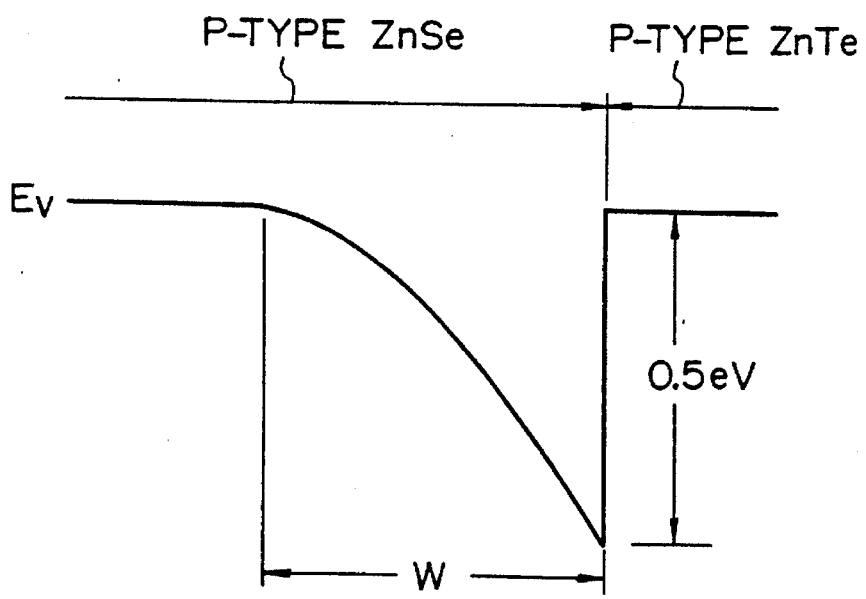
FIG. 4 is an energy band diagram of the p-type ZnSe/p-type ZnTe junction.

In addition, the band bending produced in the side of p-type ZnSe from the interface between p-type ZnSe and p-type ZnTe over the width W is given by a quadratic function of the distance x from the interface between p-type ZnSe and p-type ZnTe (see FIG. 4) as follows:

$$\Phi(x)=\Phi_T\{1-(x/W)^2\} \quad (1)$$

Therefore, the p-type ZnSe/p-type ZnTe multiquantum well layer 9 can be designed on the basis of equation (1), by varying $L_w$ in steps so that the first quantum levels $E_1$ formed in the respective quantum well layers of p-type ZnTe coincide with top energies of the valence bands of p-type ZnSe and p-type ZnTe and so that they are equal with each other. Practically, coincidence within the range of thermal energy ~kT (k: Boltzmann's constant, T: absolute temperature) is acceptable.

FIG. 2 shows an example of the design for quantum well widths $L_w$ in the p-type ZnSe/p-type ZnTe multiquantum well layer 9 in the case where the width $L_B$ of each p-type ZnSe barrier is 2 nm. Note here that the acceptor concentration $N_A$ of the p-type ZnSe contact layer 5 is $5\times10^{17}\text{cm}^{-3}$ and the acceptor concentration $N_A$ of the p-type ZnTe contact layer 6 is $5\times10^{19}\text{cm}^{-3}$. In this case, as shown in FIG. 2, the widths $L_w$ of seven quantum wells, in total, are made to vary as $L_w=0.3$ nm, 0.4 nm, 0.5 nm, 0.6 nm, 0.8 nm, 1.1 nm and 1.7 nm toward the p-type ZnTe contact layer 6 so that their quantum levels $E_1$ coincide with the Fermi levels of the p-type ZnSe and the p-type ZnTe.

When designing the widths $L_w$ of the quantum wells, since levels of respective quantum wells are coupled with each other, their interactions must be taken into consideration in a strict sense. Further, effects of strain caused by lattice mismatching between the quantum wells and the barriers must also be taken into consideration. However, it is basically possible to design the multiquantum well layer to exhibit a flat quantum level as shown in FIG. 2.

In FIG. 2, since holes injected in the p-type ZnTe can flow into the p-type ZnSe due to the tunneling effect through quantum levels $E_1$ formed in the respective quantum wells in the p-type ZnSe/p-type ZnTe multiquantum well layer 9, the potential barrier along the p-type ZnSe/p-type ZnTe interface is effectively removed. Therefore, a good voltage-current characteristic can be realized with the semiconductor laser shown in FIG. 1. Since the current crossing the p-type ZnSe/p-type ZnTe multiquantum well layer 9 is caused by the tunneling effect, a slight resistance exists. However, the use of the p-type ZnSe/p-type ZnTe multiquantum well layer 9 is greatly effective for reducing, in particular, the forward rising voltage of a diode.

For manufacturing the semiconductor laser according to the first embodiment, as shown in FIG. 1, the n-type ZnMgSSe cladding layer 2, the active layer 3, the p-type ZnMgSSe cladding layer 4, the p-type ZnSe contact layer 5, the p-type ZnSe/p-type ZnTe multiquantum well layer 9 and the p-type ZnTe contact layer 6 are epitaxially grown in this sequence on the n-type GaAs substrate 1 by the molecular beam epitaxy (MBE) method. Growth of the p-type ZnSe/p-type ZnTe multiquantum well layer 9 is readily realized only by opening and closing a molecular beam shutter of the MBE apparatus.

In the epitaxial growth by MBE, there are used Zn of purity 99.9999% as a Zn source material, Mg of purity 99.9999% as a Mg source material, ZnS of purity 99.9999% as a S source material, and Se of purity 99.9999% as a Se source material. Further, doping of Cl as an n-type impurity for the n-type ZnMgSSe cladding layer 2 is done by using $ZnCl_2$ of purity 99.9999% as a dopant, while doping of N as a p-type impurity for the p-type ZnMgSSe cladding layer 4, the p-type ZnSe contact layer 5, the p-type ZnSe/p-type ZnTe multiquantum well layer 9 and the p-type ZnTe contact layer 6 is done by irradiating $N_2$ plasma generated by a plasma gun using electron cyclotron resonance (ECR).

Figure 5:
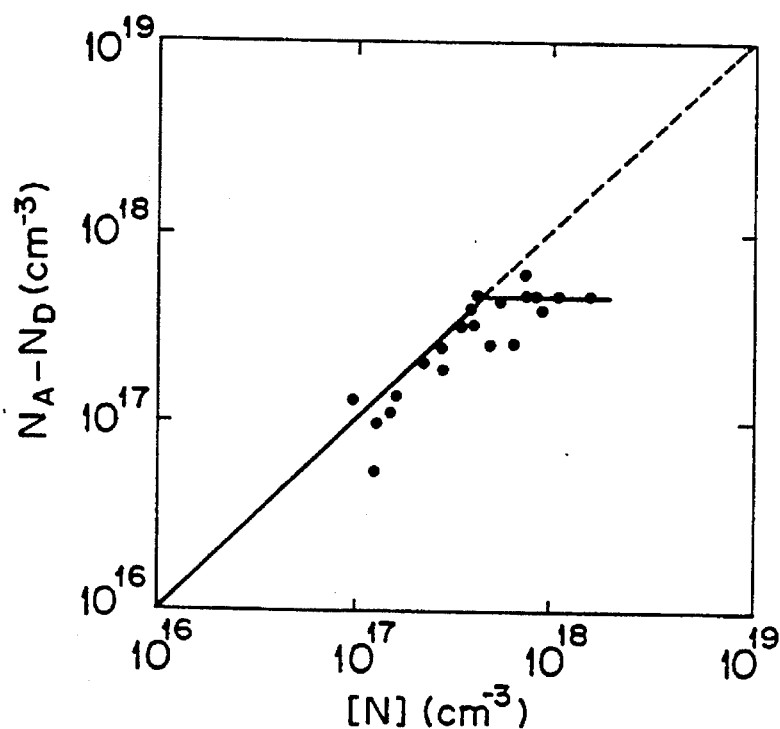
FIG. 5 is a graph illustrating the relation between the effective carrier concentration in ZnSe and the N doping concentration into ZnSe.

Regarding the doping of the p-type impurity into ZnSe, a result of measurement by the secondary ion mass spectrometry (SIMS) shows that a p-type impurity itself can be doped up to the order of $10^{18}$–$10^{19} cm^{-3}$. However, because the impurity level determined by the doping concentration of the p-type impurity is deepened, only a part of the doped impurity is activated to behave as an acceptor for supplying effective carriers. As a result, the carrier concentration obtained exhibits a low value mentioned above. FIG. 5 shows this aspect in which, regardless of an increase in the doping concentration [N] of N used as a p-type impurity, the effective carrier concentration, that is, $N_A$–$N_D$ (NA: acceptor concentration, $N_D$: donor concentration) is saturated with about $4 \times 10^{17} cm^{-3}$.

Figure 6:
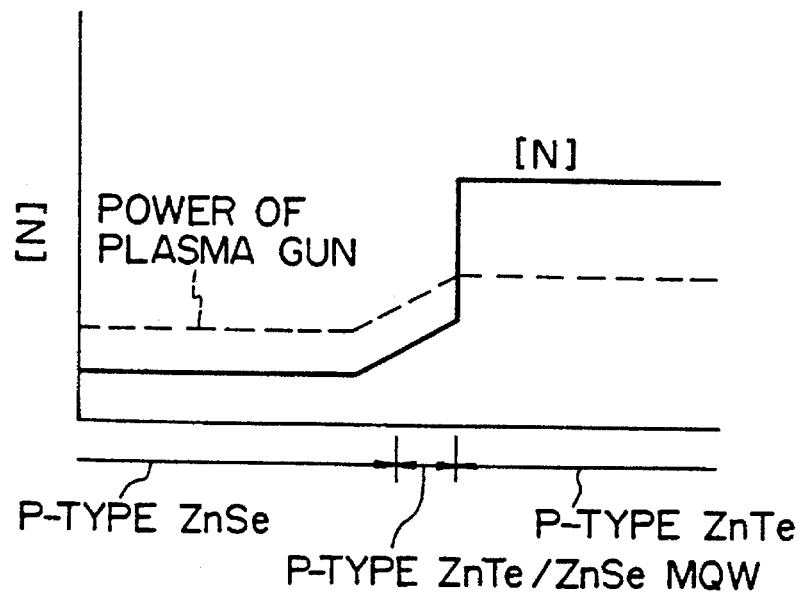
FIG. 6 is a graph illustrating a profile of the N doping concentration [N] of the portion extending from a p-type ZnSe contact layer to a p-type ZnTe contact layer in a semiconductor laser taken as a second embodiment of the invention.

A second embodiment of the invention will now be explained. FIG. 6 shows a profile of the N doping concentration [N] in the portion extending from the p-type ZnSe contact layer 5 to the p-type ZnTe contact layer 6 in FIG. 1. In FIG. 6, the N doping concentration [N] in the p-type ZnSe contact layer 5 is uniform up to the portion distant from the junction interface between the p-type ZnSe contact layer 5 and the p-type ZnTe contact layer 6 by a predetermined distance (substantially the same as the width of the depletion layer produced in the p-type ZnSe contact layer 5 along the junction between the p-type ZnSe contact layer 5 and the p-type ZnTe contact layer 6). [N] in this portion is about $4 \times 10^{17} cm^{-3}$ at which the effective carrier concentration saturates (see FIG. 5). On the other hand, in the portion of the p-type ZnSe contact layer 5 within a predetermined distance from the junction interface between the p-type ZnSe contact layer 5 and the p-type ZnTe contact layer 6, [N] continuously increases toward the junction interface. Then [N] increases stepwise in the junction interface to exhibit a sufficiently high value, for example, $2 \times 10^{18} cm^{-3}$ as compared with [N] in the p-type ZnTe contact layer 6 (see FIG. 6). The carrier concentration in the p-type ZnTe contact layer 6 does not saturate at the [N] value of this order.

The [N] value in the portion of the p-type ZnSe contact layer 5 within a predetermined distance from the junction interface between the p-type ZnSe contact layer 5 and the p-type ZnTe contact layer 6 is beyond the value at which the carrier concentration saturates, and the N impurity level is deep. However, holes trapped in the deep levels can be made to fall in the p-type ZnTe contact layer 6. Therefore, a modulation of N as shown in FIG. 6 can decrease the width of the depletion layer in the p-type ZnSe contact layer 5 and can increase [N] in the p-type ZnTe contact layer 6. As a result, an increased amount of current can flow in the semiconductor laser.

As described above, the carrier concentration in the p-type ZnSe contact layer 5 can be on the order of $5 \times 10^{17} cm^{-3}$ and the carrier concentration in the p-type ZnTe contact layer 6 can be on the order of $10^{19} cm^{-3}$. On the other hand, a band discontinuity of about 0.5 eV exists in the valance bands in the junction interface between the p-type ZnSe contact layer 5 and the p-type ZnTe contact layer 6 (see FIG. 4). If the junction is a step junction, a band bending is produced in the valence bands in a portion of the p-type ZnSe contact layer 5 along the junction between the p-type ZnSe contact layer 5 and the p-type ZnTe contact layer 6 over the width:

$$W=(2\epsilon\Phi_T/qN_A)^{1/2} \qquad (2)$$

where q is the absolute value of the charge of an electron, $\epsilon$ is the permittivity of ZnSe, $\Phi_T$ is the magnitude of the discontinuity in the valence bands at the junction interface between the p-type ZnSe contact layer 5 and the p-type ZnTe contact layer 6 (about 0.5 eV).

When the acceptor concentration $N_A$ of a portion of the p-type ZnSe contact layer 5 excluding the highly doped portion near the junction interface is $5 \times 10^{17} cm^{-3}$ and the acceptor concentration $N_A$ of the highly doped portion thereof is $1 \times 10^{18} cm^{-3}$ in average, calculation of W using equation (2) results in W=23 nm. On the other hand, W is 32 nm when no highly doped portion is provided in the portion of the p-type ZnSe contact layer 5 near the junction interface. That is, because of the use of the highly doped portion in the portion of the p-type ZnSe contact layer 5 near the junction interface, the width W of the depletion layer is smaller by about 9 nm than that in a structure with no highly doped portion. Because of the decreased width W of the depletion layer, holes can more easily pass through the junction between the p-type ZnSe contact layer 5 and the p-type ZnTe contact layer 6 due to a tunneling effect.

Figure 7:
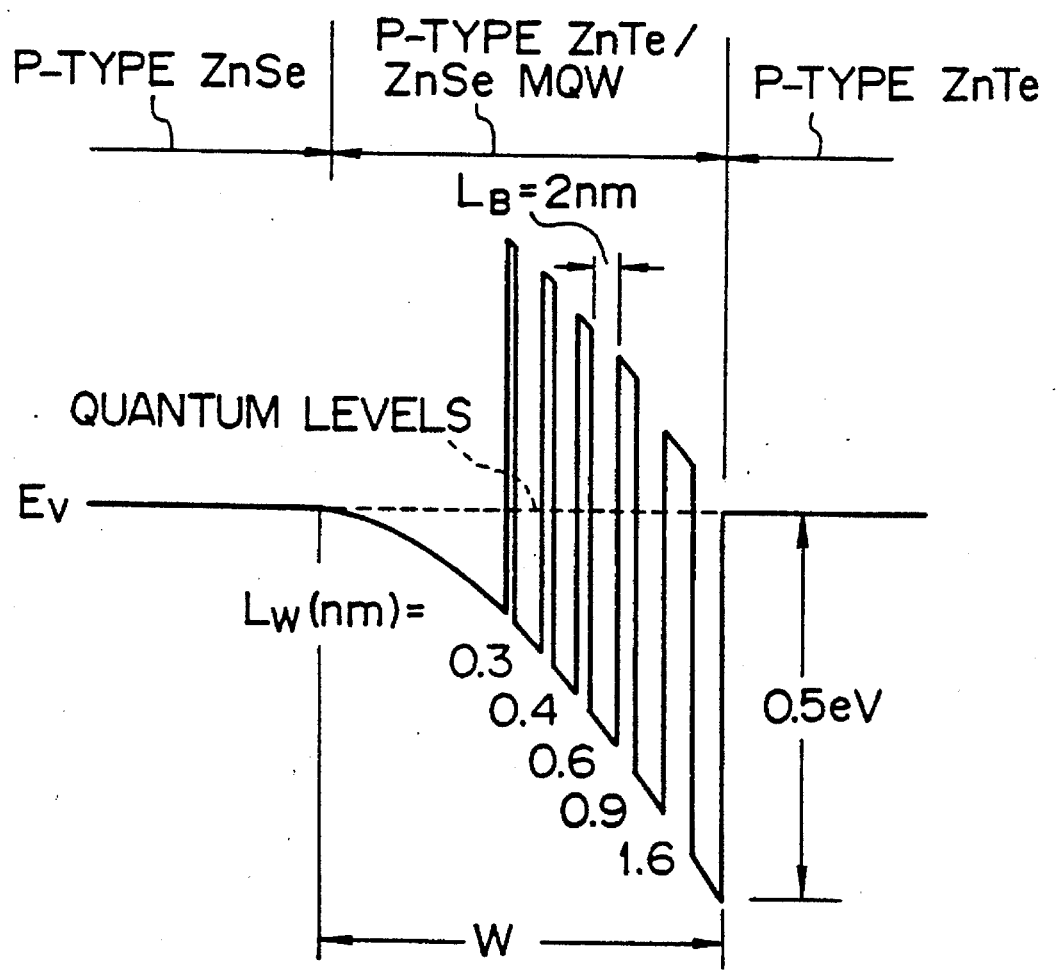
FIG. 7 is an energy band diagram of the portion extending from the p-type ZnSe contact layer to the p-type ZnTe contact layer in the semiconductor laser taken as the second embodiment.

FIG. 7 shows an example of the design for widths $L_w$ of quantum wells in the p-type ZnSe/p-type ZnTe multiquantum well layer 9 in the case where the width $L_B$ of the p-type ZnSe barrier layer thereof is 2 nm. Note here that the acceptor concentration $N_A$ in the p-type ZnSe contact layer 5 is $5 \times 10^{17} cm^{-3}$, that the doping concentration [N] gradually increases toward the p-type ZnTe contact layer 6 and exhibits $1 \times 10^{18} cm^{-3}$ in average in the p-type ZnSe/p-type ZnTe multiquantum well layer 9, and that the acceptor concentration $N_A$ in the p-type ZnTe contact layer 6 is $1 \times 10^{19} cm^{-3}$. In this case, as shown in FIG. 7, the widths $L_w$ of five quantum wells, in total, are made to vary as $L_w$=0.3 nm, 0.4 nm, 0.6 nm, 0.9 nm and 1.6 nm toward the p-type ZnTe contact layer 6 so that their first quantum levels $E_1$ coincide with the Fermi levels of p-type ZnSe and p-type ZnTe.

As mentioned above, because of the use of the p-type ZnSe/p-type ZnTe multiquantum well layer 9 in the depletion layer produced in the p-type ZnSe contact layer 5 along the junction between the p-type ZnSe contact layer 5 and the p-type ZnTe contact layer 6, the potential barrier between the p-type ZnSe contact layer 5 and the p-type ZnTe contact layer 6 is effectively removed by a resonant tunneling effect through first quantum levels $E_1$ of the respective quantum wells in the p-type ZnSe/p-type ZnTe multiquantum well layer 9, and holes can readily move through the junction between the p-type ZnSe contact layer 5 and the p-type ZnTe contact layer 6.

In order to manufacture the semiconductor laser according to the second embodiment, the foregoing method for manufacturing the semiconductor laser according to the first embodiment is used, and the power supplied to the plasma gun is varied in the form along the profile of [N] as shown by a broken line in FIG. 6, in order to obtain the doping profile shown in FIG. 6, when doping of N is done for the p-type ZnSe contact layer 5, the p-type ZnSe/p-type ZnTe multiquantum well layer 9 and the p-type ZnTe contact layer 6. The doping of the p-type impurity using the plasma gun permits relatively easy control of the doping amount and the deep level near the junction interface between the p-type ZnSe contact layer 5 and the p-type ZnTe contact layer 6.

In the semiconductor laser according to the second embodiment, since the portion of the p-type ZnSe contact layer 5 near the junction interface between the p-type ZnSe contact layer 5 and the p-type ZnTe contact layer 6 has a higher N doping concentration [N] than the other portion, the width of the depletion layer produced in the p-type ZnSe contact layer 5 in the junction can be decreased, and holes can easily pass through the junction. In addition, since the p-type ZnSe/p-type ZnTe multiquantum well layer 9 is provided in the junction, the potential barrier is effectively removed from the junction.

Figure 8:
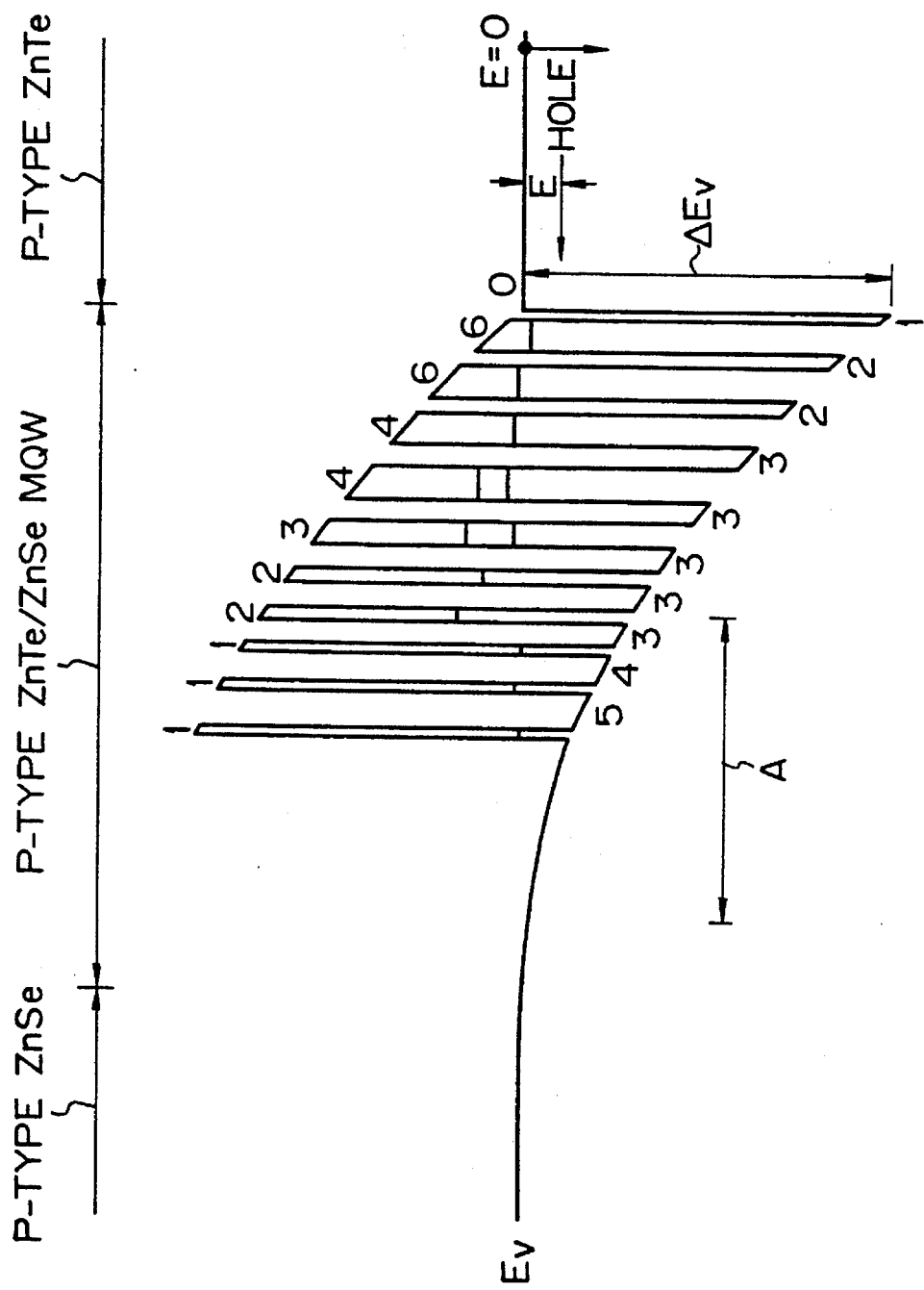
FIG. 8 is an energy band diagram of the portion extending from a p-type ZnSe contact layer to a p-type ZnTe contact layer in a semiconductor laser taken as a third embodiment of the invention.

A third embodiment of the invention will now be described. A semiconductor laser according to the third embodiment has the structure shown in FIG. 1. FIG. 8 shows an energy band diagram of a portion of the p-type ZnSe/p-type ZnTe multiquantum well layer 9 extending from the p-type ZnSe contact layer 5 to the p-type ZnTe contact layer 6. FIG. 8 also shows the number of atomic layers forming each of quantum wells and barriers constituting the p-type ZnSe/p-type ZnTe multiquantum well layer 9. As shown in FIG. 8, respective quantum wells vary in thickness $L_w$ toward the p-type ZnTe contact layer 6 to read: one atomic layer (about 0.3 nm), one atomic layer (about 0.3 nm), one atomic layer (about 0.3 nm), two atomic layers (about 0.6 nm), two atomic layers (about 0.6 nm), three atomic layers (about 0.9 nm), four atomic layers (about 1.2 nm), four atomic layers (about 1.2 nm), six atomic layers (about 1.8 nm), and six atomic layers (about 1.8 nm). In contrast, $L_B$ varies toward the p-type ZnTe contact layer 6 to read: five atomic layer (about 1.5 nm), four atomic layer (about 1.2 nm), three atomic layer (about 0.9 nm), three atomic layer (about 0.9 nm), three atomic layers (about 0.9 nm), three atomic layers (about 0.9 nm), two atomic layers (about 0.6 nm), two atomic layers (about 0.6 nm) and one atomic layer (about 0.3 nm). Quantum levels of respective quantum wells are shown by horizontal solid lines in the quantum wells in FIG. 8. Note that, in FIG. 8, the depletion layer produced in the p-type ZnSe contact layer 5 along the junction between the p-type ZnSe contact layer 5 and the p-type ZnTe contact layer 6 has a width (see W in FIG. 4) of about 30 nm. In correspondence therewith, the acceptor concentration in the p-type ZnSe contact layer 5 is about $5.7 \times 10^{17} \text{cm}^{-3}$ and the acceptor concentration in the p-type ZnTe contact layer 6 is $1 \times 10^{19} \text{cm}^{-3}$. The p-type ZnSe contact layer 5 and the p-type ZnTe contact layer 6 are assumed to form a step junction.

Figure 9:
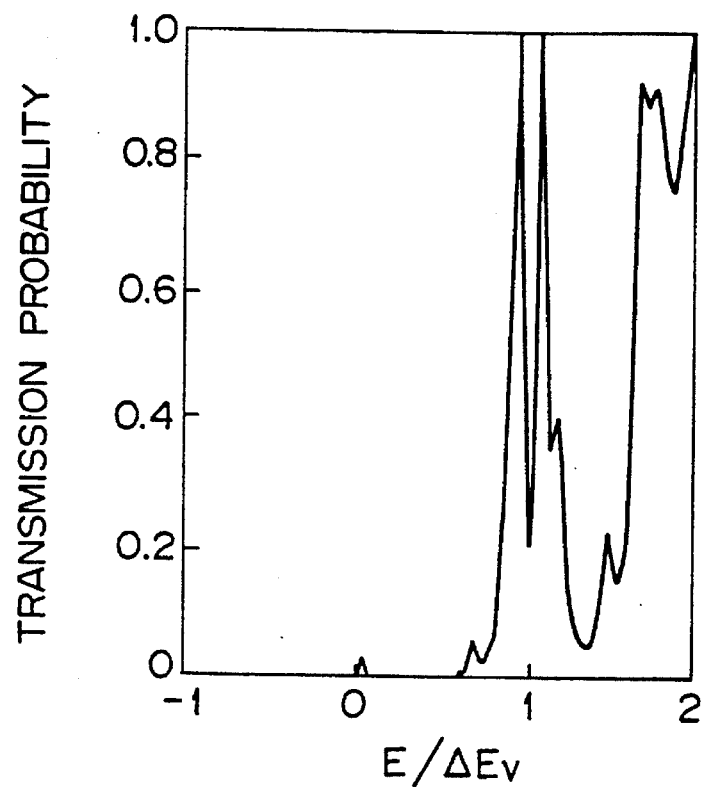
FIG. 9 is a graph illustrating a result of calculation showing how the transmission probability of holes through the p-type ZnSe/p-type ZnTe depends on energy, in the semiconductor laser taken as the third embodiment.

FIG. 9 shows a result of calculation to show how the transmission probability of holes through the p-type ZnSe/p-type ZnTe junction depends on energy in the structure in which the p-type ZnSe/p-type ZnTe multiquantum well layer 9 is provided in the depletion layer produced in the p-type ZnSe contact layer 5 (see FIG. 1) in the junction shown in FIG. 8. The abscissa of FIG. 9 shows the energy E of holes normalized by the discontinuity $\Delta E_v$ in valence bands at the junction interface between the p-type ZnSe contact layer 5 and the p-type ZnTe contact layer 6, that is, $E/\Delta E_v$, where the energy E is measured from the origin placed at the top of the valence band of p-type ZnTe.

As shown in FIG. 9, near the portion where $E/\Delta E_v$ is zero, that is, where the bias voltage applied to the junction is zero, transmission probability of holes through the junction is very small. This is because, with respect to a portion (A in FIG. 8) where the curvature of the valence band in the depletion layer produced in the p-type ZnSe contact layer 5 along the junction between the p-type ZnSe contact layer 5 and the p-type ZnTe contact layer 6 is small, the third embodiment makes it very difficult to determine quantum levels that permit transmission of holes by a resonant tunneling effect between quantum levels of quantum wells remoter from the p-type ZnTe contact layer 6 and those of quantum wells nearer to the p-type ZnTe contact layer 6.

Figure 10:
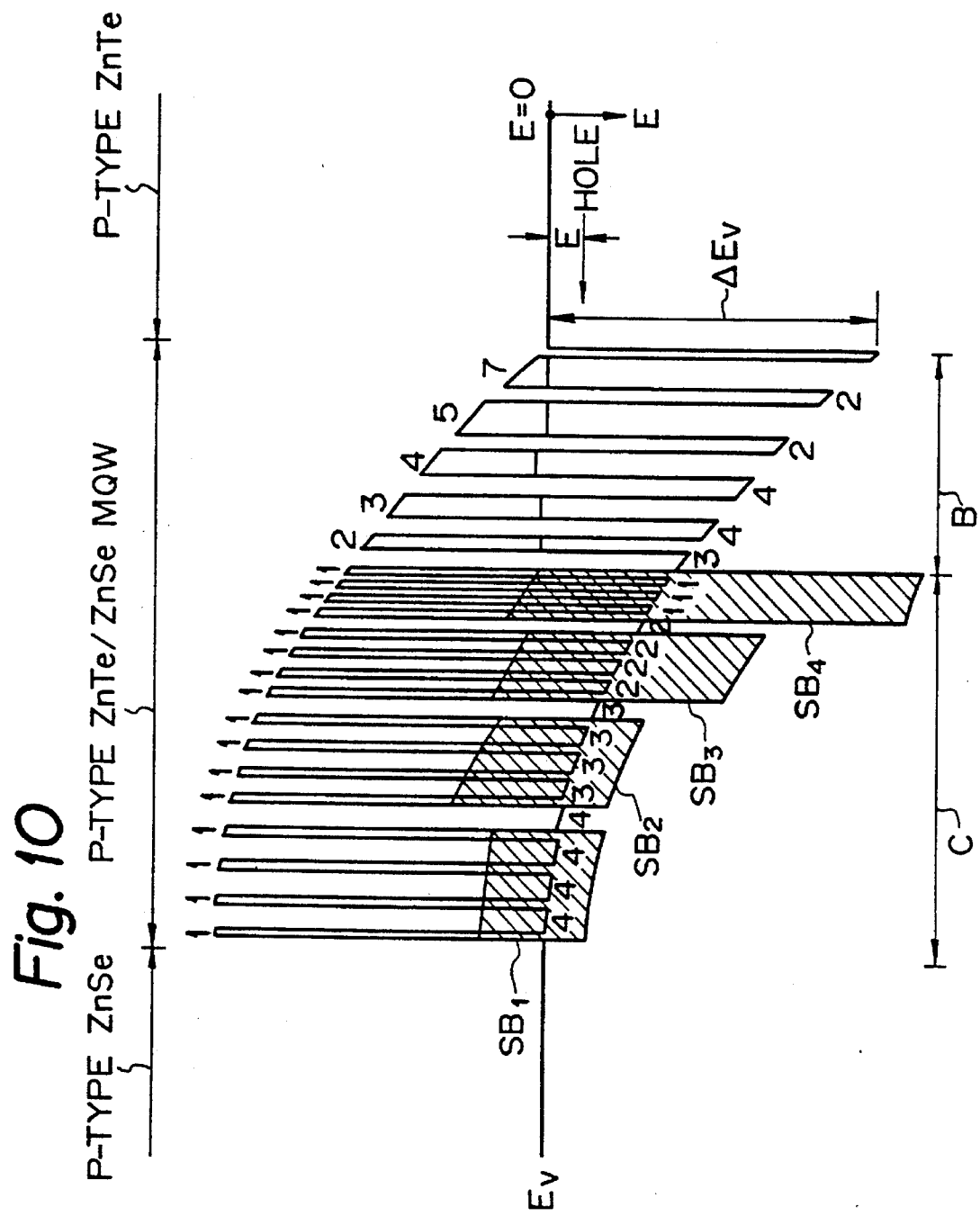
FIG. 10 is an energy band diagram of the portion extending from a p-type ZnSe contact layer to a p-type ZnTe contact layer in a semiconductor laser taken as a fourth embodiment of the invention.

A fourth embodiment of the invention will now be explained. A semiconductor laser according to the fourth embodiment of the invention has the structure shown in FIG. 1. FIG. 10 shows an energy band diagram of a portion of the p-type ZnSe/p-type ZnTe multiquantum well layer 9 extending from the p-type ZnSe contact layer 5 to the p-type ZnTe contact layer 6. In FIG. 10, the p-type ZnSe/p-type ZnTe multiquantum well layer 9 has twenty-one quantum wells. FIG. 10 shows the thickness of each quantum well or barrier in terms of the number of atomic layers forming thereof. As shown in FIG. 10, thicknesses $L_w$ of respective quantum wells vary toward the p-type ZnTe contact layer 6 to read: one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), one atomic layer (about 0.3 nm), two atomic layers (about 0.6 nm), three atomic layers (about 0.9 nm), four atomic layer (about 1.2 nm), five atomic layers (about 1.5 nm), and seven atomic layers (about 2.1 nm). Thicknesses $L_B$ of barriers vary toward the p-type contact layer 6 to read: four atomic layers (about 1.2 nm), four atomic layers (about 1.2 nm), four atomic layers (about 1.2 nm), four atomic layers (about 1.2 nm), three atomic layers (about 0.9 nm), three atomic layers (about 0.9 nm), three atomic layers (about 0.9 nm), three atomic layers (about 0.9 nm), two atomic layers (about 0.6 nm), two atomic layers (about 0.6 nm), two atomic layers (about 0.6 nm), two atomic layers (0.6 nm), one atomic layer (about 0.3 nm), one atomic layer (about 0.3 nm), one atomic layer (0.3 nm), three atomic layers (about 0.9 nm), four atomic layers (about 1.2 nm), four atomic layers (about 1.2 nm), two atomic layers and two atomic layers (about 0.6 nm).

In this case, in the portion of the p-type ZnSe/p-type ZnTe multiquantum well layer 9 nearer to the p-type ZnTe contact layer 6 (see B in FIG. 10), where the sum of the thickness $L_w$ of each quantum well and the thickness $L_B$ of an adjacent barrier $L_w+L_B$ is relatively large, quantum levels of respective quantum wells are discretized, and these quantum levels substantially coincide with the tops of valence bands of the p-type ZnSe contact layer 5 and the p-type ZnTe contact layer 6. Quantum levels of respective quantum wells in portion B are shown by horizontal solid lines in FIG. 10. On the other hand, in the portion of the p-type ZnSe/p-type ZnTe multiquantum well layer 9 remoter from the p-type ZnTe contact layer 6 (see C in FIG. 10), where the sum of the thickness $L_w$ of each quantum well and the thickness $L_B$ of an adjacent barrier $L_w+L_B$ is small enough to reinforce the coupling between adjacent quantum wells, sub-bands $SB_1$, $SB_2$, $SB_3$, and $SB_4$ are produced. Widths of these sub-bands $SB_1$, $SB_2$, $SB_3$, and $SB_4$ decrease gradually from the sub-band $SB_1$ produced in the portion where $L_W+L_B$ is largest to the sub-band $SB_4$ produced in the portion where $L_W+L_B$ is smallest. In addition, these sub-bands $SB_1$, $SB_2$, $SB_3$, and $SB_4$ include the top energies of valence bands of the p-type ZnSe contact layer 5 and the p-type ZnTe contact layer 6.

Note, in FIG. 10, that the width of the depletion layer (see W in FIG. 4) produced in the p-type ZnSe contact layer 5 along the junction between the p-type ZnSe contact layer 5 and the p-type ZnTe contact layer 6 is about 30 nm. In correspondence therewith, the acceptor concentration in the p-type ZnSe contact layer 5 is about $5.7\times10^{17} cm^{-3}$, and the acceptor concentration in the p-type ZnTe contact layer 6 is about $1\times10^{19} cm^{-3}$. The p-type ZnSe contact layer 5 and the p-type ZnTe contact layer 6 are assumed to form a step junction.

Figure 11:
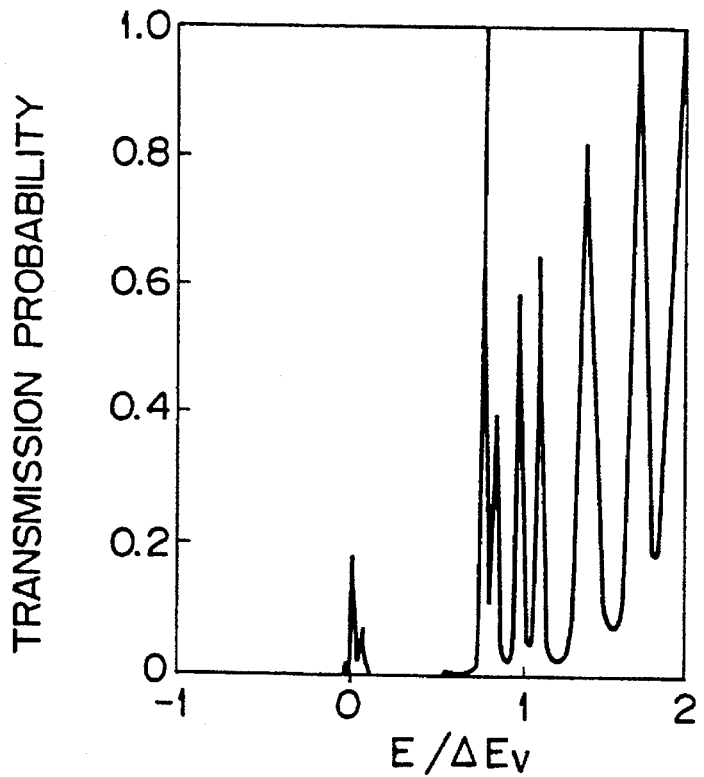
FIG. 11 is a graph showing a result of calculation showing how the transmission probability of holes through the p-type ZnSe/p-type ZnTe depends on energy, in the semiconductor laser taken as the fourth embodiment.

FIG. 11 shows a result of calculation to show how the transmission probability of holes through the p-type ZnSe/p-type ZnTe junction depends on energy in the structure including the p-type ZnSe/p-type ZnTe multiquantum well layer 9 in the depletion layer produced in the p-type ZnSe contact layer 5 in the junction shown in FIG. 10. The abscissa of FIG. 11 shows the energy E of holes normalized by the discontinuity $\Delta E_v$ in valence bands at the junction interface between the p-type ZnSe contact layer 5 and the p-type ZnTe contact layer 6, that is, $E/\Delta E_v$, where the energy E is measured from the origin placed at the top of the valence band of p-type ZnTe contact layer 6.

As shown in FIG. 11, when $E/\Delta E_v$ is near zero, that is, when the bias voltage applied to the junction is near zero, transmission probability of holes through the junction is significantly large as compared with that in case of FIG. 9, and the energy width providing such a high transmission probability is also significantly large. This results from the following reason. In the portion where the curvature of the valence band in the depletion layer produced in the p-type ZnSe along the junction between the p-type ZnSe and the p-type ZnTe is small, that is, in the portion shown at C in FIG. 10, there are made sub-bands $SB_1$, $SB_2$, $SB_3$ and $SB_4$ having widths in which the top energies of valence bands of the p-type ZnSe contact layer 5 and the p-type ZnTe contact layer 6 are involved. Therefore, due to a resonant tunneling effect through the sub-bands $SB_1$, $SB_2$, $SB_3$ and $SB_4$ discrete quantum levels formed in the respective quantum ells in the portion nearer to the p-type ZnTe contact layer 6 than the portion shown at C, that is, in the portion shown at B, holes can readily transmit through the junction.

According to the semiconductor laser taken as the fourth embodiment, the p-type ZnSe/p-type ZnTe multiquantum well layer 9 is formed in the depletion layer produced in the p-type ZnSe contact layer 5 along the junction between the p-type ZnSe contact layer 5 and the p-type ZnTe contact layer 6, discrete quantum levels substantially equal to the top energies of valence bands of the p-type ZnSe and the p-type ZnTe are provided in the respective quantum wells in the portion of the p-type ZnSe/p-type ZnTe multiquantum well layer 9 remoter from the p-type ZnTe contact layer 6, and the sub-bands $SB_1$, $SB_2$, $SB_3$ and $SB_4$ having widths including the top energies of valence bands of the p-type ZnSe and the p-type ZnTe are formed in the quantum wells in the portion of the p-type ZnSe/p-type ZnTe multiquantum well layer 9 nearer to the p-type ZnTe contact layer 6. As a result, transmission probability of holes through the junction between the p-type ZnSe contact layer 5 and the p-type ZnTe contact layer 6 can be increased when the bias voltage applied to the junction is near zero. As a result, an increased amount of current can flow in the junction. In addition, since this alleviates requirements for operating the semiconductor laser, it is possible to stabilize the operation, to elongate the life time and to improve the reliability of the semiconductor laser.

As described above, the invention realizes a semiconductor laser having a good current-voltage characteristic and capable of emitting blue or green light.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the embodiments have been described as being applied to a semiconductor laser, the invention can be applied to a light emitting diode. In a more general aspect, the invention can be applied to various semiconductor devices having a p—p junction or an n—n junction including a band discontinuity in valence band or in conduction band along its junction interface. The invention can also be applied to semiconductor devices including a junction between a metal and a semiconductor having a large difference in work function.

What is claimed is:

1. A semiconductor metal contacting structure comprising:

a first p-type compound semiconductor layer;

a second p-type compound semiconductor layer on said first p-type compound semiconductor layer;

a contacting metal on said second p-type compound semiconductor layer;

a multiquantum well layer in a depletion layer produced between said first p-type compound semiconductor layer and said second p-type compound semiconductor layer, said multiquantum well layer having a plurality of quantum wells and a plurality of barriers, at least one of said quantum wells and said barriers having different thicknesses.

2. A semiconductor metal contacting structure according to claim 1, wherein said multiquantum well layer forming quantum levels which become a path for holes.

3. A semiconductor metal contacting structure according to claim 1, wherein said first p-type compound semiconductor layer being made of p-type ZnSe and said second p-type compound semiconductor layer being made of p-type ZnTe.

4. A semiconductor metal contacting structure comprising:

a first n-type compound semiconductor layer;

a second n-type compound semiconductor layer on said first n-type compound semiconductor layer;

a contacting metal on said second n-type compound semiconductor layer;

a multiquantum well layer in a depletion layer produced between said first n-type compound semiconductor layer and said second n-type compound semiconductor layer, wherein said first n-type compound semiconductor layer having an impurity concentration which is higher in a portion adjacent to an interface between said first n-type compound semiconductor layer and said second n-type compound semiconductor layer than in a portion spaced from said interface.

5. A semiconductor metal contacting structure according to claim 4, wherein said impurity concentration of said first n-type compound semiconductor layer gradually increases toward the interface between said first n-type compound semiconductor layer and said second n-type compound semiconductor layer.

6. A semiconductor metal contacting structure according to claim 4, wherein said multiquantum well layer forming quantum levels which become a path for electrons.

7. A light emitting device comprising:
   a substrate;
   an n-type cladding layer on said substrate;
   an active layer on said n-type cladding layer;
   a p-type cladding layer on said active layer; and
   a semiconductor metal contacting structure, wherein said semiconductor metal contacting structure comprises a first p-type compound semiconductor layer; a second p-type compound semiconductor layer on said first p-type compound semiconductor layer; a contacting metal on said second p-type compound semiconductor layer; a multiquantum well layer in a depletion layer produced between said first p-type compound semiconductor layer and said second p-type compound semiconductor layer, said multiquantum well layer having a plurality of quantum wells and a plurality of barriers, at least one of said quantum wells and said barriers having a different thickness.

8. A light emitting device according to claim 7, wherein said multiquantum well layer forming quantum levels.

9. A light emitting device according to claim 8, wherein said first p-type compound semiconductor layer being made of p-type ZnSe, and said second p-type compound semiconductor layer being made of p-type ZnTe.

10. A light emitting device according to claim 7, wherein said first p-type compound semiconductor layer has an impurity concentration which is higher in a portion adjacent to an interface between said first p-type compound semiconductor layer and said second p-type compound semiconductor layer than that of other portions of the first p-type compound semiconductor layer.

11. A light emitting device according to claim 7, wherein said first p-type compound semiconductor layer has an impurity concentration which gradually increases toward an interface between said first p-type compound semiconductor layer and said second p-type compound semiconductor layer.

12. A light emitting device according to claim 7, wherein thicknesses of said quantum wells increase toward said second p-type compound semiconductor layer.

* * * * *